(12) United States Patent
Kawai et al.

(10) Patent No.: US 10,561,051 B2
(45) Date of Patent: Feb. 11, 2020

(54) MOVEMENT ERROR DETECTION APPARATUS OF MOUNTING HEAD, AND COMPONENT MOUNTING APPARATUS

(71) Applicant: YAMAHA HATSUDOKI KABUSHIKI KAISHA, Iwata-shi, Shizuoka-ken (JP)

(72) Inventors: Tarou Kawai, Shizuoka (JP); Ryousuke Nakamura, Shizuoka (JP); Kota Ito, Shizuoka (JP)

(73) Assignee: YAMAHA HATSUDOKI KABUSHIKI KAISHA, Iwata-shi, Shizuoka-ken (JP)

( * ) Notice: Subject to any disclaimer, the term of this patent is extended or adjusted under 35 U.S.C. 154(b) by 80 days.

(21) Appl. No.: 16/068,067

(22) PCT Filed: Jan. 8, 2016

(86) PCT No.: PCT/JP2016/050583
§ 371 (c)(1),
(2) Date: Jul. 3, 2018

(87) PCT Pub. No.: WO2017/119142
PCT Pub. Date: Jul. 13, 2017

(65) Prior Publication Data
US 2020/0022292 A1 Jan. 16, 2020

(51) Int. Cl.
*H05K 13/08* (2006.01)
*H05K 13/04* (2006.01)
(Continued)

(52) U.S. Cl.
CPC ......... *H05K 13/0812* (2018.08); *G06T 7/248* (2017.01); *H04N 5/247* (2013.01);
(Continued)

(58) Field of Classification Search
CPC ........... H05K 13/0812; H05K 13/0411; H05K 13/0815; H05K 13/0406; H05K 13/0409;
(Continued)

(56) References Cited

U.S. PATENT DOCUMENTS

| 8,339,445 | B2 * | 12/2012 | Yoro | ............. H01L 21/681 348/77 |
| 2009/0171504 | A1 * | 7/2009 | Hyung | ............. G01C 21/12 700/254 |

(Continued)

FOREIGN PATENT DOCUMENTS

| CN | 101689512 A | 3/2010 |
| JP | H08-018289 A | 1/1996 |

(Continued)

OTHER PUBLICATIONS

Liu et al, On-line realizations of dynamic gap detection and control for levitated industrial steel plate conveyance system (Year: 2012).*

(Continued)

*Primary Examiner* — Shan E Elahi
(74) *Attorney, Agent, or Firm* — Studebaker & Brackett PC

(57) ABSTRACT

A movement error detection apparatus includes a movable region inside mark made of a projected image arranged in a movable region of a movable conveyor of each of first and second substrate conveyance devices; and a pair of movable region outside marks respectively provided on both sides of the movable region inside mark and arranged at a position outside the movable region of the movable conveyor and outward of a substrate at a work position; an imaging device which moves together with a mounting head; and a control device that selects two marks, among the marks, which are positioned on both outer sides of the substrate and are closest to the substrate, and causes the first substrate recognition camera to image the marks, as well as obtaining a movement (Continued)

error of the first mounting head on the basis of the two mark images.

16 Claims, 16 Drawing Sheets

(51) Int. Cl.
G06T 7/246 (2017.01)
H04N 5/247 (2006.01)
(52) U.S. Cl.
CPC ..... *H05K 13/0411* (2018.08); *H05K 13/0815* (2018.08); *G06T 2207/30164* (2013.01); *G06T 2207/30204* (2013.01); *H05K 13/0406* (2018.08); *H05K 13/0409* (2018.08)
(58) Field of Classification Search
CPC .................... H04N 5/247; G06T 7/248; G06T 2207/30164; G06T 2207/30204
USPC .......................................................... 348/95
See application file for complete search history.

(56) References Cited

U.S. PATENT DOCUMENTS

| | | | | |
|---|---|---|---|---|
| 2010/0171824 A1* | 7/2010 | Utsumi | .............. | H05K 13/0812 348/95 |
| 2010/0220183 A1* | 9/2010 | Yoro | ................. | H01L 21/67144 348/86 |
| 2010/0295935 A1* | 11/2010 | Case | .................. | H05K 13/0812 348/95 |
| 2013/0138246 A1* | 5/2013 | Gutmann | ............. | G05D 1/0231 700/253 |
| 2013/0138247 A1* | 5/2013 | Gutmann | ............. | G05D 1/0231 700/253 |
| 2014/0031980 A1* | 1/2014 | Gutmann | ............. | G05D 1/0231 700/253 |
| 2014/0300730 A1* | 10/2014 | Onishi | ................... | G01B 11/14 348/95 |
| 2015/0049183 A1* | 2/2015 | Yamakage | ........... | G02B 3/0037 348/95 |
| 2016/0052315 A1* | 2/2016 | Aoyama | .................. | B41J 29/38 347/19 |

FOREIGN PATENT DOCUMENTS

| | | |
|---|---|---|
| JP | 3253218 B2 | 2/2002 |
| JP | 2005-197564 A | 7/2005 |
| JP | 2009-010176 A | 1/2009 |
| JP | 4343710 B2 | 10/2009 |
| JP | 5495260 B2 | 5/2014 |

OTHER PUBLICATIONS

An Office Action mailed by the State Intellectual Property Office of the People's Republic of China dated Jun. 11, 2019, which corresponds to Chinese Patent Application No. 201680073630.9 and is related to U.S. Appl. No. 16/068,067.

International Search Report issued in PCT/JP2016/050583; dated Apr. 12, 2016.

* cited by examiner

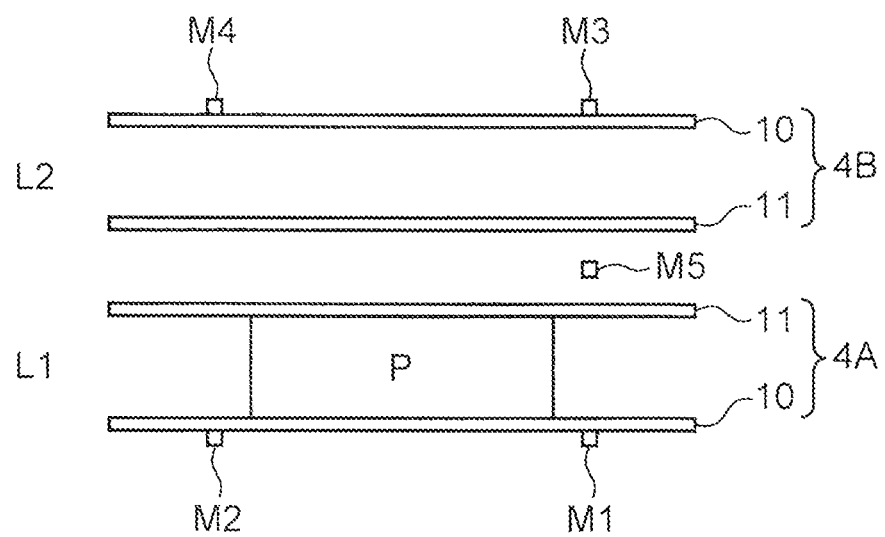

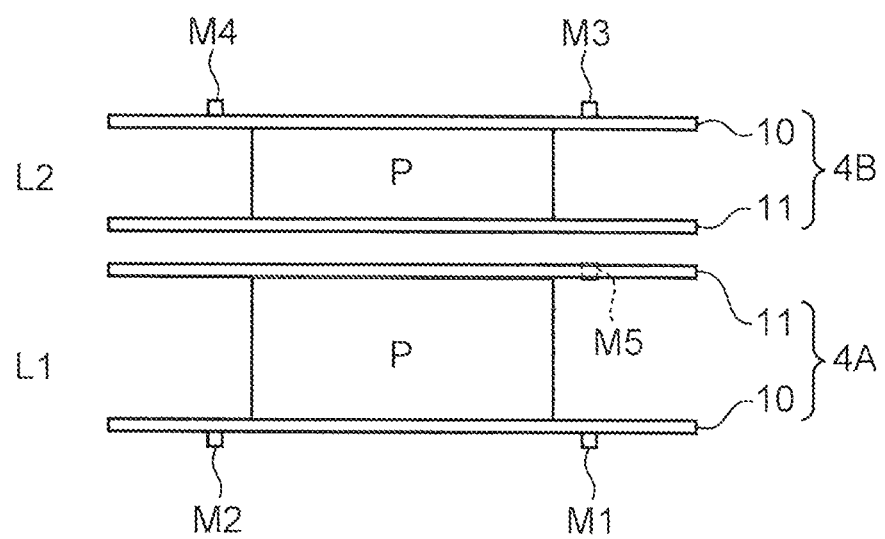

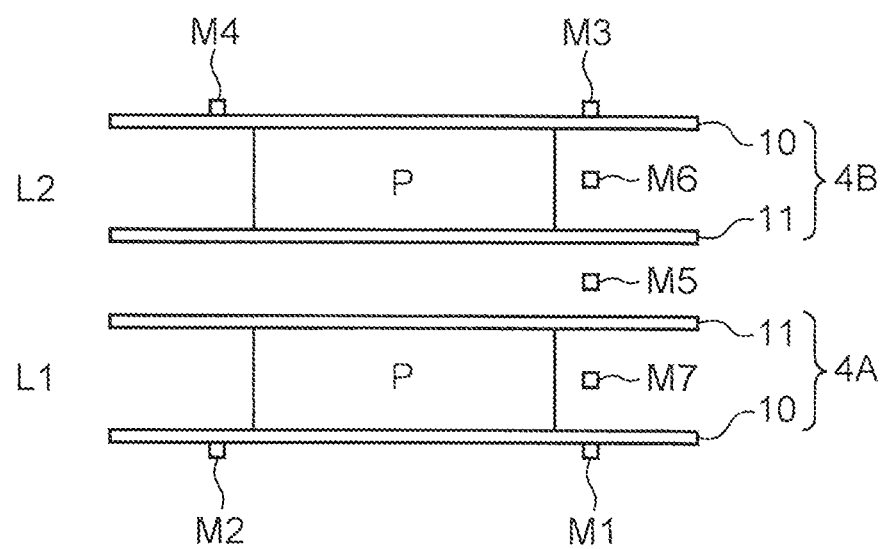

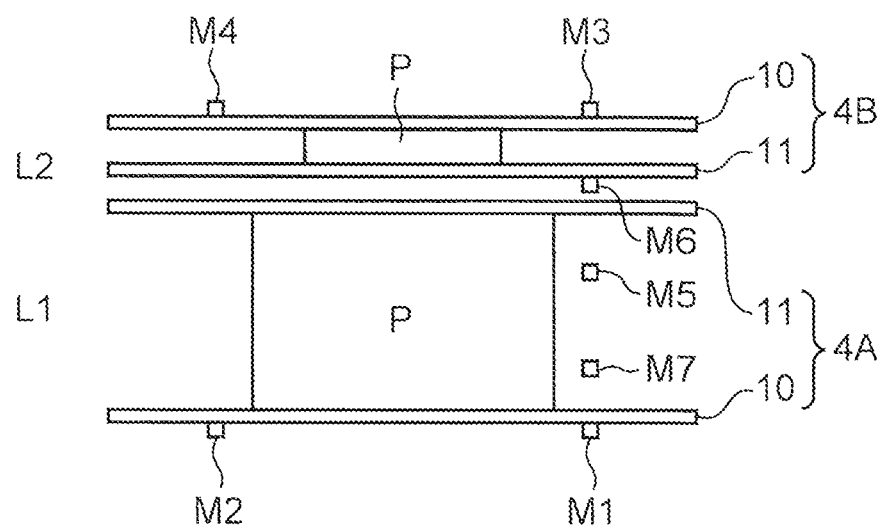

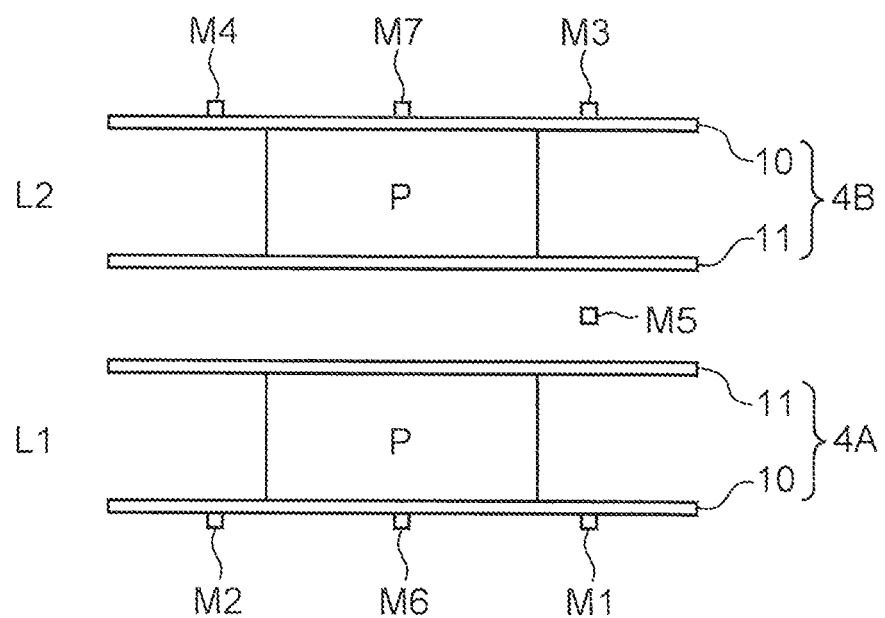

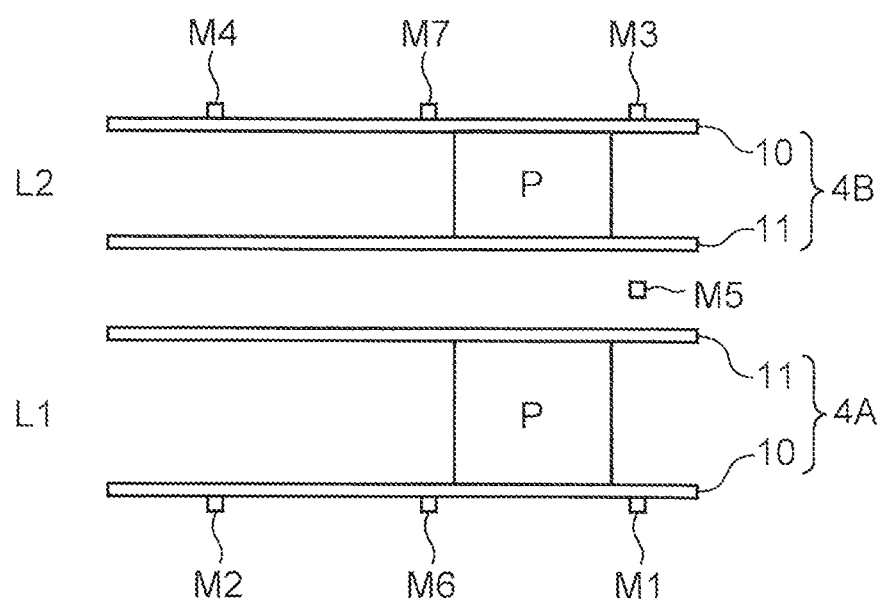

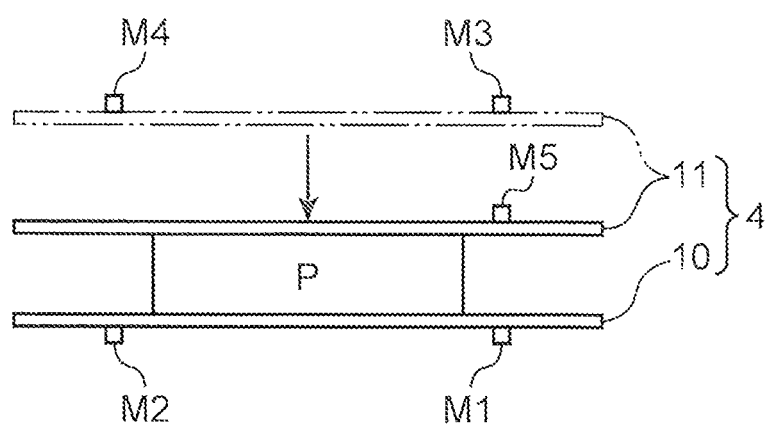

MOVEMENT ERROR DETECTION APPARATUS OF MOUNTING HEAD, AND COMPONENT MOUNTING APPARATUS

CROSS-REFERENCE TO RELATED APPLICATION

This application is a National Stage of International Patent Application No. PCT/JP2016/050583, filed Jan. 8, 2016, the entire content of which is incorporated herein by reference.

BACKGROUND

Technical Field

The present disclosure relates to a movement error detection apparatus of a mounting head, the movement error detection apparatus being incorporated into a component mounting apparatus for correcting a movement error of a mounting head caused by thermal deformation of a drive system, and to a component mounting apparatus including the movement error detection apparatus.

Background Art

A conventional component mounting apparatus includes a drive system which causes a mounting head to horizontally move, in which successive mounting operation causes the drive system to have thermal deformation due to heating thereof. Such thermal deformation causes deviation between a mounting head and a component of a component supply portion or a substrate, which is one factor of reduction in mounting precision. Under these circumstances, in order to solve the problem, a camera for recognizing a substrate, the camera moving together with a mounting head, is used to image and recognize a plurality of marks provided in a movable region of the mounting head, detect a change of a distance between the marks as a movement error of the mounting head due to thermal deformation of a drive system, and correct a target loading position of a component on the basis of the movement error.

For example, Japanese Patent No. 3253218 discloses a technique of correcting a target loading position of a component on the basis of an imaging result obtained by imaging each of marks, the marks being provided in proximity to a pair of conveyors for conveying a substrate, the pair being composed of a fixed conveyor and a movable conveyor, and the marks including a pair of marks aligned in an X direction along the fixed conveyor and a pair of marks aligned in a Y direction. In this technique, in order to avoid interference with the movable conveyor, the pair of marks in the Y direction is provided outside a movable region of the movable conveyor. Therefore, it is expected that a substrate with a small size will cause a mark position and an actual substrate position to be largely spaced apart from each other (cause a correction area to be larger than a substrate size) to make it difficult to ensure correction precision.

On the other hand, Japanese Patent No. 5495260 discloses a technique of correcting a target loading position of a component on the basis of an imaging result obtained by imaging a pair of marks provided on a pair of conveyors for conveying a substrate, the pair of conveyors including a fixed conveyor and a movable conveyor and the paired marks being deviated from each other in a direction along the conveyor (an X direction). According to the technique, because the marks move together with the movable conveyor, such problem as described in Japanese Patent No. 3253218 is solved. However, since a position of each of the marks itself involves a movement error, it is difficult to ensure correction precision.

SUMMARY

The present disclosure provides a movement error detection apparatus to correct a movement error of a mounting head caused by thermal deformation of a drive system with higher precision according to a size and a position of a substrate.

Thus, the present disclosure provides a movement error detection apparatus of a mounting head to be applied to a component mounting apparatus equipped with a substrate conveyance device which includes a fixed conveyor extending in a first direction and a movable conveyor which is movable in a second direction orthogonal to the first direction with respect to the fixed conveyor, and equipped with a mounting head which mounts a component on a substrate conveyed by the substrate conveyance device to a predetermined work position. The movement error detection apparatus of a mounting head includes a movable region inside mark made of a projected image or a reflected image formed in a movable region of the movable conveyor, and a pair of movable region outside marks respectively provided on both sides of the movable region inside mark in the second direction and arranged outside the movable region of the movable conveyor and outward of the substrate at the work position. The movement error detection apparatus of a mounting head further includes an imaging device which moves together with the mounting head; a control device which selects, among the movable region inside mark and the pair of movable region outside marks, two marks that are positioned on both outer sides of the substrate in the second direction and are closest to the substrate, and causes the imaging device to image the marks, and a calculation device which obtains a movement error of the mounting head on a basis of two mark images picked up by the imaging device.

BRIEF DESCRIPTION OF THE DRAWINGS

FIG. 7A is a plan schematic view of the first and second substrate conveyance devices showing one form of arrangement of the movable conveyor in a parallel mounting mode;

FIG. 8 is a plan schematic view of the first and second substrate conveyance devices in which a fifth mark is hidden by the movable conveyor;

FIG. 9A is a plan schematic view of a modification example of the component mounting apparatus;

FIG. 9B is a plan schematic view of the first and second substrate conveyance devices in the parallel mounting mode of the component mounting apparatus shown in FIG. 9A;

FIG. 10A is a plan schematic view showing another modification example of the component mounting apparatus;

FIG. 10B is a plan schematic view of the first and second substrate conveyance devices in the parallel mounting mode of the component mounting apparatus shown in FIG. 10A;

FIG. 11B is a plan schematic view showing a state of the conveyor when a small-sized substrate is conveyed in the component mounting apparatus shown in FIG. 11A.

DETAILED DESCRIPTION

In the following, embodiments of the present disclosure will be described with reference to accompanying drawings.

[Configuration of Component Mounting Apparatus]

Figure 1:
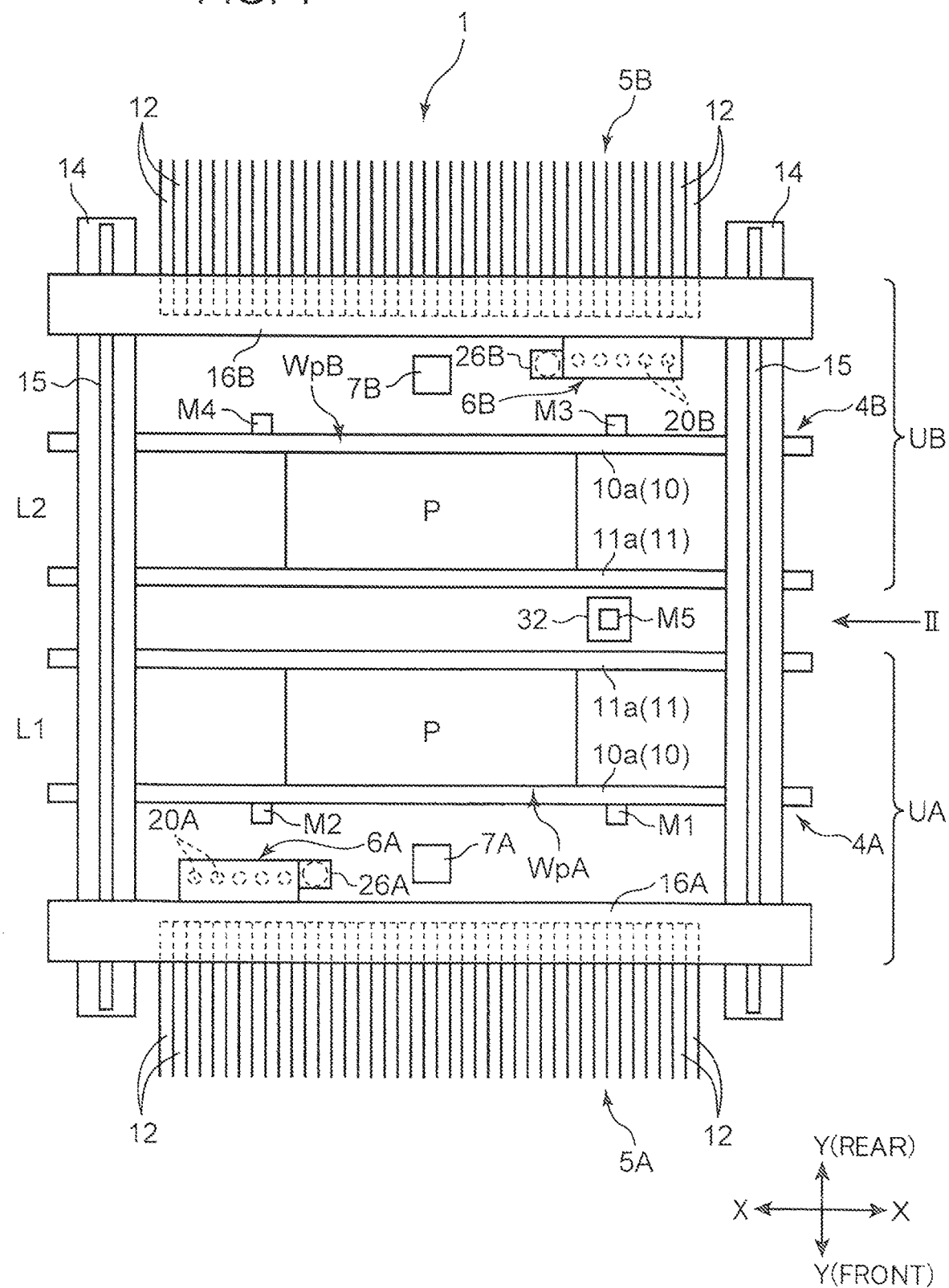
FIG. 1 is a plan schematic view of a component mounting apparatus (a component mounting apparatus to which a movement error detection apparatus of a mounting head of the present disclosure is applied) of the present disclosure.

A component mounting apparatus 1 shown in FIG. 1 employs a dual lane system and includes first and second mounting units UA and UB. The first and second mounting units UA and UB are provided for two lanes L1 and L2 (first lane L1, second lane L2) embodied on a base 2 having a rectangular structure (see FIG. 2), respectively, by substrate conveyance devices 4A and 4B which will be described later. In the following description, a horizontal direction parallel to the lanes L1 and L2 is set to be an X direction, a horizontal direction orthogonal to the X direction is set to be a Y direction, and a vertical direction is set to be a Z direction. One end side in the Y direction (underside of FIG. 1) is set to be a front side. When simply referred to as an upstream side and a downstream side, a conveyance direction of a substrate P to be described later is used as a reference. In this example, the X direction corresponds to a first direction of the present disclosure and the Y direction corresponds to a second direction of the present disclosure.

As shown in FIG. 1, the component mounting apparatus 1 includes the first mounting unit UA on a front side thereof and the second mounting unit UB on a rear side thereof. The first and second mounting units UA and UB are not only schematically symmetrical in a front-rear direction but also common in a basic configuration.

The first mounting unit UA includes the first substrate conveyance device 4A constituting the first lane L1 as a conveyance path of the substrate P such as a printed wiring board, a first component supply portion 5A, a first head unit 6A for mounting a component, a head unit drive mechanism which drives the first head unit 6A, and a first component recognition camera 7A.

The substrate conveyance device 4A includes a pair of belt-type conveyors 10 and 11 each extending in parallel to each other in the X direction (the first direction), and a conveyor drive mechanism which synchronously drives these conveyors 10 and 11 with a servo motor as a drive source. The substrate conveyance device 4A receives the substrate P from the right side in the figure to convey the substrate P to a predetermined work position (to be referred to as a position of the substrate P/a first work position WpA shown in the figure), and holds the substrate P by a substrate holding device (not shown) which has a push-up pin or the like. Then, after mounting work, the substrate P is carried out to the left side in the figure.

Of the pair of conveyors 10 and 11, the conveyor 10 on the front side is a fixed conveyor which is fixed to the base 2 (hereinafter, appropriately referred to as the fixed conveyor 10) and the conveyor 11 on the rear side is a movable conveyor which is movable in the Y direction (the second direction) with respect to the fixed conveyor 10 (hereinafter, appropriately referred to as the movable conveyor 11). The substrate conveyance device 4A further includes a rail fixed to the base 2 and extending in the Y direction and a conveyor width variable mechanism which moves the movable conveyor 11 along the rail with a servo motor 13 (hereinafter referred to as a C-axis servo motor 13, see FIG. 3) as the drive source. This configuration enables the substrate conveyance device 4A to change an interval between the conveyors 10 and 11 according to a size of the substrate P.

The conveyors 10 and 11 respectively have conveyor main bodies 10a and 11a extending in the X direction and a pair of leg portions (not shown) extending below and at different positions in a longitudinal direction of the conveyor main bodies 10a and 11a. The leg portions of the fixed conveyor 10 are fixed to the base 2 and the leg portions of the movable conveyor 11 are movably supported on the rail.

The component supply portion 5A is arranged forward of the substrate conveyance device 4A. In the component supply portion 5A, a plurality of tape feeders 12 for supplying components with a tape as a carrier is arranged in parallel to each other along the substrate conveyance device 4A. These tape feeders 12 include a reel around which a tape housing and holding a small-piece chip component such as an IC, a transistor, and a capacitor is wound, and which supplies a component to a predetermined take-out position while intermittently feeding the tape from the reel.

The first head unit 6A takes out a component from the component supply portion 5A to convey the component onto the substrate P and load (mount) the component on the substrate P. The first head unit 6A is movable by the head unit drive mechanism in the X direction and the Y direction in a fixed region. The head unit drive mechanism includes a pair of fixed rails 15 respectively fixed to a pair of elevated frames 14 provided at both ends in the X direction on the base 2 and extending in parallel to each other in the Y direction, a supporting member 16 supported by these fixed rails 15 to extend in the X direction, and a screw feeding mechanism which causes the supporting member 16 to move in the Y direction with an Y-axis servo motor 17 (see FIG. 3) as a drive source. Additionally, the head unit drive mechanism includes a fixed rail fixed by the supporting member 16 to movably support the first head unit 6A in the X direction, and a screw feeding mechanism which causes the first head unit 6A to move with an X-axis servo motor 18 (see FIG. 3) as a drive source. In other words, the head unit drive mechanism causes the first head unit 6A to move in the X direction by the drive of the X-axis servo motor 18 and causes the supporting member 16 to move in the Y direction by the drive of the Y-axis servo motor 17. As a result, the first head unit 6A moves in the X and Y directions within a fixed region.

The first head unit 6A includes a plurality of first mounting heads 20A each equipped with a nozzle for sucking a component, a head lifting mechanism which causes the first mounting heads 20A to go up and down (to move in the Z direction) with a Z-axis servo motor 22 (see FIG. 3) as a drive source, and a head rotation mechanism which causes the first mounting heads 20A to rotate around a center axis thereof with an R-axis servo motor 24 (see FIG. 3) as a drive source. Each nozzle of the first mounting heads 20A, which is connected to a negative pressure generation device, sucks a component by a negative pressure supplied from the negative pressure generation device.

The first head unit 6A is mounted with a first substrate recognition camera 26A. The first substrate recognition camera 26A moves together with the first head unit 6A to image a fiducial mark, not shown, (a mark for recognizing a substrate) which is attached to the substrate P, as well as imaging marks M1 to M5 to be described later which are for detecting movement errors of the head units 6A and 6B. The first substrate recognition camera 26A includes a camera main body including an area sensor such as a CCD and an optical system and arranged downward, and an illumination device. The component mounting apparatus 1 recognizes a position of the substrate P on the basis of an image of a fiducial mark imaged by the first substrate recognition camera 26A, as well as correcting a target position of a component mounted by the first head unit 6A (the first mounting head 20A) on the basis of images of the marks M1 to M5 which will be described in detail later.

On the other hand, the first component recognition camera 7A, which images a component sucked by the first mounting heads 20A before mounting, is fixed on the base 2. The first component recognition camera 7A includes a camera main body including a line sensor such as a CCD and an optical system and arranged upward on the base 2, and an illumination device. The component mounting apparatus 1 recognizes a suction state of a component by the first mounting heads 20A on the basis of an image of the component picked up by the first component recognition camera 7A.

The foregoing is the configuration of the first mounting unit UA. The second mounting unit UB includes the second substrate conveyance device 4B constituting the second lane L2 as a conveyance path of the substrate P, a second component supply portion 5B, the second head unit 6B for mounting a component, a head unit drive mechanism which drives the second head unit 6B, and a second component recognition camera 7B. The second substrate conveyance device 4B and the like of the second mounting unit UB have a structure schematically symmetrical in the front-rear direction with respect to the first substrate conveyance device 4A and the like of the first mounting unit UA.

Figure 5A:
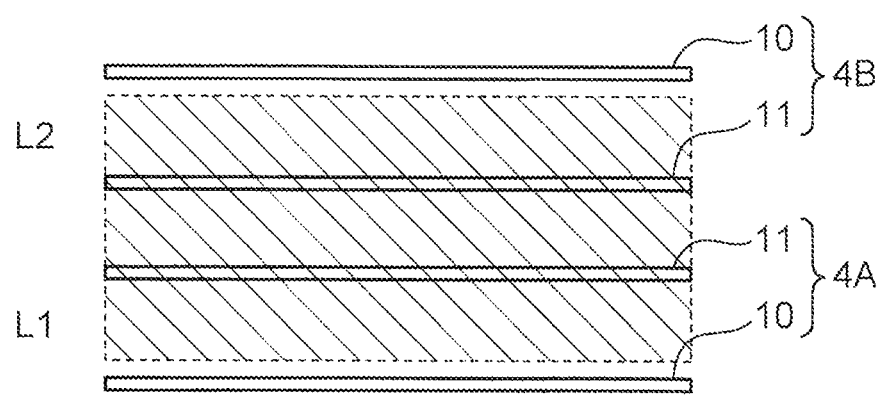
FIG. 5A is a plan schematic view of first and second substrate conveyance devices in which a movable region of a movable conveyor is shown.
Figure 5B:
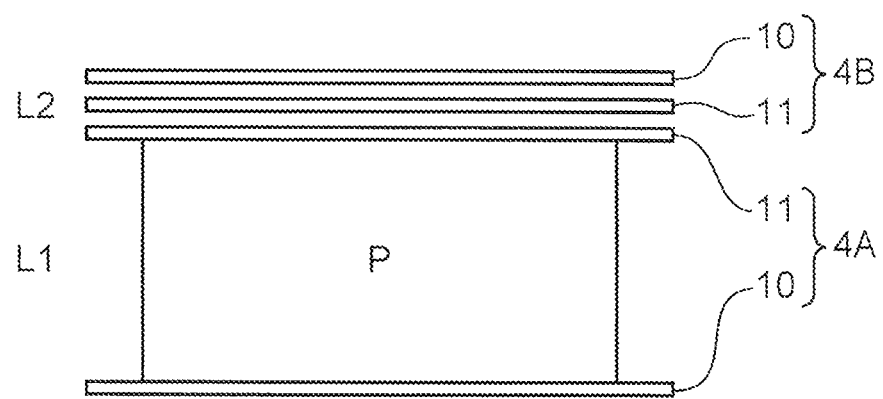
FIG. 5B is a plan schematic view of the first and second substrate conveyance devices showing one form of arrangement of the movable conveyor.

Specifically, similarly to the first substrate conveyance device 4A, the second substrate conveyance device 4B has the fixed conveyor 10 and the movable conveyor 11, the fixed conveyor 10 being positioned on the rear side and the movable conveyor 11 being positioned on the front side. The movable conveyors 11 of the substrate conveyance devices 4A and 4B are each supported by the above common rail which extends in the Y direction and are movable in a region indicated by slant lines in FIG. 5A, that is, are movable within a region between both the fixed conveyors 10 as a movable region. This enables the movable conveyors 11 of the substrate conveyance devices 4A and 4B to be movable from a state where the movable conveyor 11 of the second substrate conveyance device 4B is arranged at a position closest to the fixed conveyor 10 and the movable conveyor 11 of the first substrate conveyance device 4A is arranged at a position closest to the movable conveyor 11 of the second substrate conveyance device 4B as shown in, for example, FIG. 5B to a state where the movable conveyor 11 of the first substrate conveyance device 4A is arranged at a position closest to the fixed conveyor 10 and the movable conveyor 11 of the second substrate conveyance device 4B is arranged at a position closest to the movable conveyor 11 of the first substrate conveyance device 4A.

The second head unit 6B is common to the first head unit 6A in being supported by the supporting member 16. However, while the first head unit 6A is arranged on the rear side of the supporting member 16, the second head unit 6B is arranged on the front side of the supporting member 16. In this manner, the first head unit 6A and the second head unit 6B are provided to face to each other in the front-rear direction. A configuration of the head unit drive mechanism which drives the second head unit 6B is basically common to a configuration of the head unit drive mechanism which drives the first head unit 6A. Each supporting member 16 of the head units 6A and 6B is supported by the common fixed rails 15 as shown in FIG. 1. This enables the first head unit 6A to move onto the substrate P of the second lane L2 or conversely enables the second head unit 6B to move onto the substrate P of the first lane L1.

Additionally, while the first component recognition camera 7A is arranged between the first substrate conveyance device 4A and the first component supply portion 5A, the second component recognition camera 7B is arranged between the second substrate conveyance device 4B and the second component supply portion 5B.

The second head unit 6B includes a second mounting head 20B and a second substrate recognition camera 26B as shown in FIG. 1. Additionally a work position (a position of the substrate P shown in the figure) of the substrate conveyance device 4B will be referred to as a second work position WpB. In this example, the first substrate recognition camera 26A of the first head unit 6A corresponds to a first imaging device of the present disclosure and the second substrate recognition camera 26B of the second head unit 6B corresponds to a second imaging device of the present disclosure.

Figure 6:
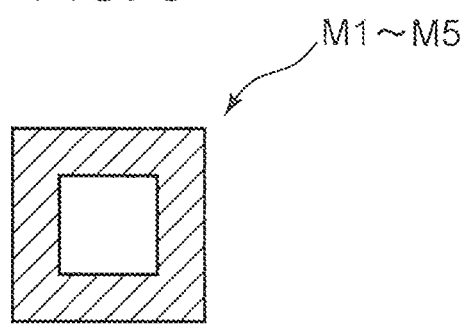
FIG. 6 is a plan view of a mark.

The first to fifth marks M1 to M5 for correcting a movement error of each of the head units 6A and 6B caused by thermal deformation of the head unit drive mechanism are provided on the periphery of the first substrate conveyance device 4A and the second substrate conveyance device 4B. In other words, when the head units 6A and 6B are driven for a long period of time, a screw shaft of the screw feeding mechanism and the elevated frames 14 thermally deform (thermally expand) in a longitudinal direction to generate an error in an amount of movement of the head units 6A and 6B (i.e. the mounting heads 20A and 20B). Therefore, the component mounting apparatus 1 is provided with the rectangular marks M1 to M5 with voids as shown in, for example, FIG. 6, and the marks M1 to M5 are imaged by the above substrate recognition cameras 26A and 26B of the head units 6A and 6B to detect movement errors of the head units 6A and 6B on the basis of the images.

Figure 2:
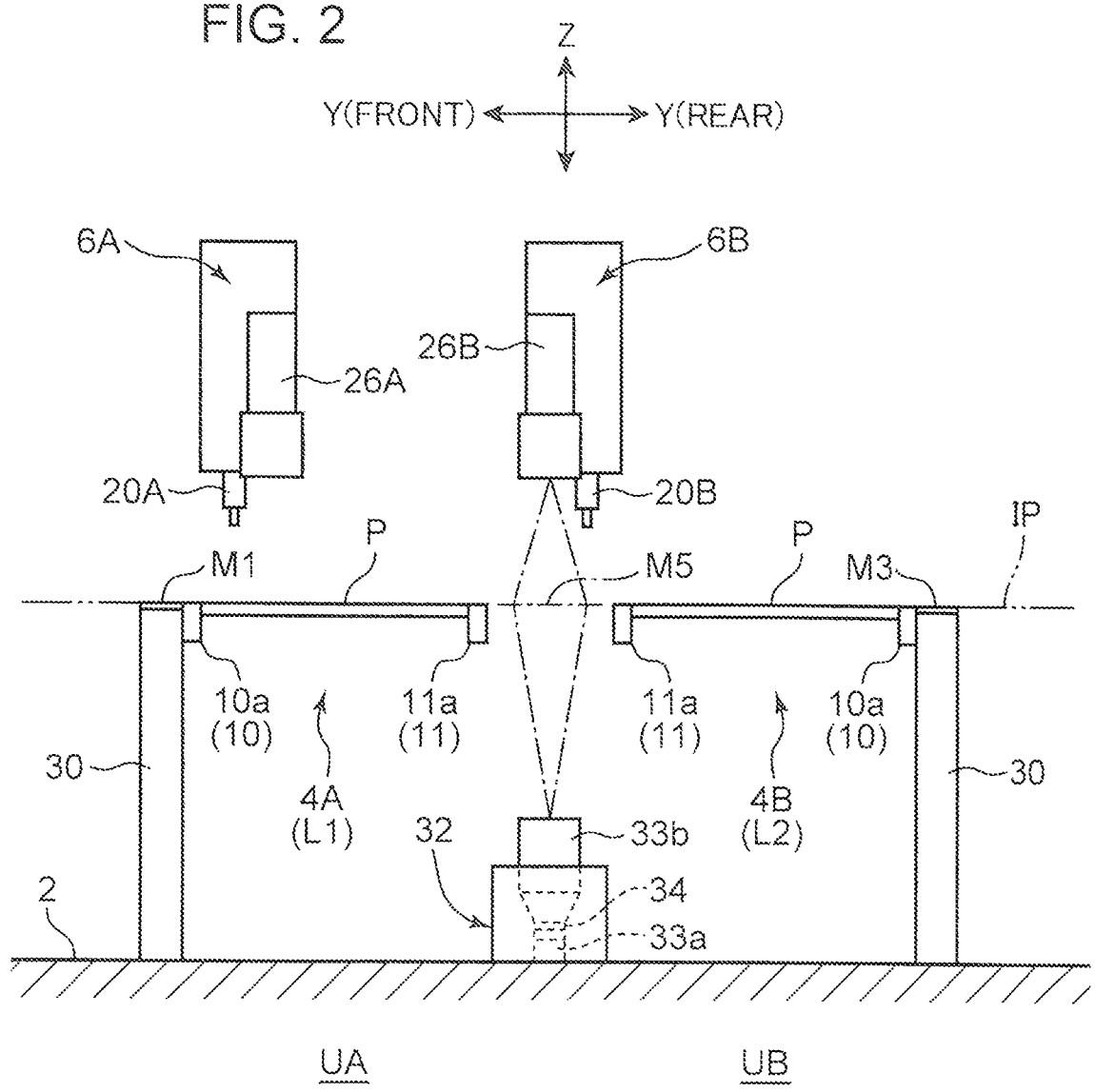
FIG. 2 is a side view of the component mounting apparatus (a view seen from an arrow in an II direction in FIG. 1)

A specific arrangement of each of the marks M1 to M5 is as follows. First, the first and second marks M1 and M2 are provided in order from the upstream side along the fixed conveyor 10 of the first substrate conveyance device 4A, and the third and fourth marks M3 and M4 are provided in order from the upstream side along the fixed conveyor 10 of the second substrate conveyance device 4B. As shown in FIGS. 1 and 2, the first and second marks M1 and M2 are provided on an upper end surface of a support 30 which is fixed on the base 2 along a front face of the fixed conveyor 10, and the third and fourth marks M3 and M4 are provided on the upper end surface of the support 30 which is fixed on the base 2 along a rear face of the fixed conveyor 10. The first and third marks M1 and M3 are aligned in the Y direction at positions upstream the work position Wp and the second and fourth marks M2 and M4 are aligned in the Y direction at a position downstream of the work position Wp.

The first to fourth marks M1 to M4 are made of, for example, engraved plates, stickers, or the like fixed to the support 30 and provided at positions of the heights identical with each other. Specifically, the marks are provided at the height identical with that of the substrate P held at the work position Wp by the substrate holding device, that is, the marks are provided to be positioned within a reference plane IP which is a virtual horizontal plane including an upper face of the substrate P as shown in FIG. 2. These first to fourth marks M1 to M4 are positioned outside the fixed conveyors 10 of the lanes L1 and L2 (i.e. outside the movable region of the movable conveyor 11).

The fifth mark M5 is provided at a middle position between the first mark M1 and the third mark M3 in the Y direction. The fifth mark M5 is formed by an unsubstantial projected image formed on the reference plane IP. In detail, a projection device 32 is provided at a position of the fifth mark M5 on the base 2. The projection device 32 includes a resin film 34 on which a figure of the fifth mark is drawn, an illumination portion 34a and an optical system 34b, the illumination portion 34a being configured to radiate illumination light to a film 33 from a back thereof (from the underside) and the optical system 34b being configured to form a projected image (focused image) on the above reference plane IP. In other words, the substrate recognition cameras 26A and 26B of the head units 6A and 6B have a focal distance set to be capable of imaging a fiducial mark on the substrate P arranged at the work position Wp, and as shown in FIG. 2, the substrate recognition cameras 26A and 26B are arranged above the projection device 32 so as to be capable of picking up the projected image of the figure of the fifth mark (i.e. the fifth mark M5) formed by the projection device 32.

The projection device 32 is arranged at a position which is lower than the conveyor main body 11a of the movable conveyor 11 and which is arranged out, in the X direction, of a movement path (a position of the rail) of the leg portion of the movable conveyor 11. Thus, the projection device 32 absorbs a height difference from the reference plane IP to enable the substrate recognition cameras 26A and 26B to pick up a focused image of the fifth mark M5 on the reference plane IP. In this manner, the component mounting apparatus 1 is configured to substantially have the fifth mark M5 provided in the movable region of the movable conveyor 11 while avoiding interference with the movable conveyor 11. In this example, the fifth mark M5 corresponds to a movable region inside mark of the present disclosure and the first mark M1 and the third mark M3 corresponds to a pair of movable region outside marks of the present disclosure.

Next, control systems of the component mounting apparatus 1 which control the first and second mounting units UA and UB will be described. The component mounting apparatus 1 has a control unit 40 which generally controls operation of the first and second mounting units UA and UB.

Figure 3:
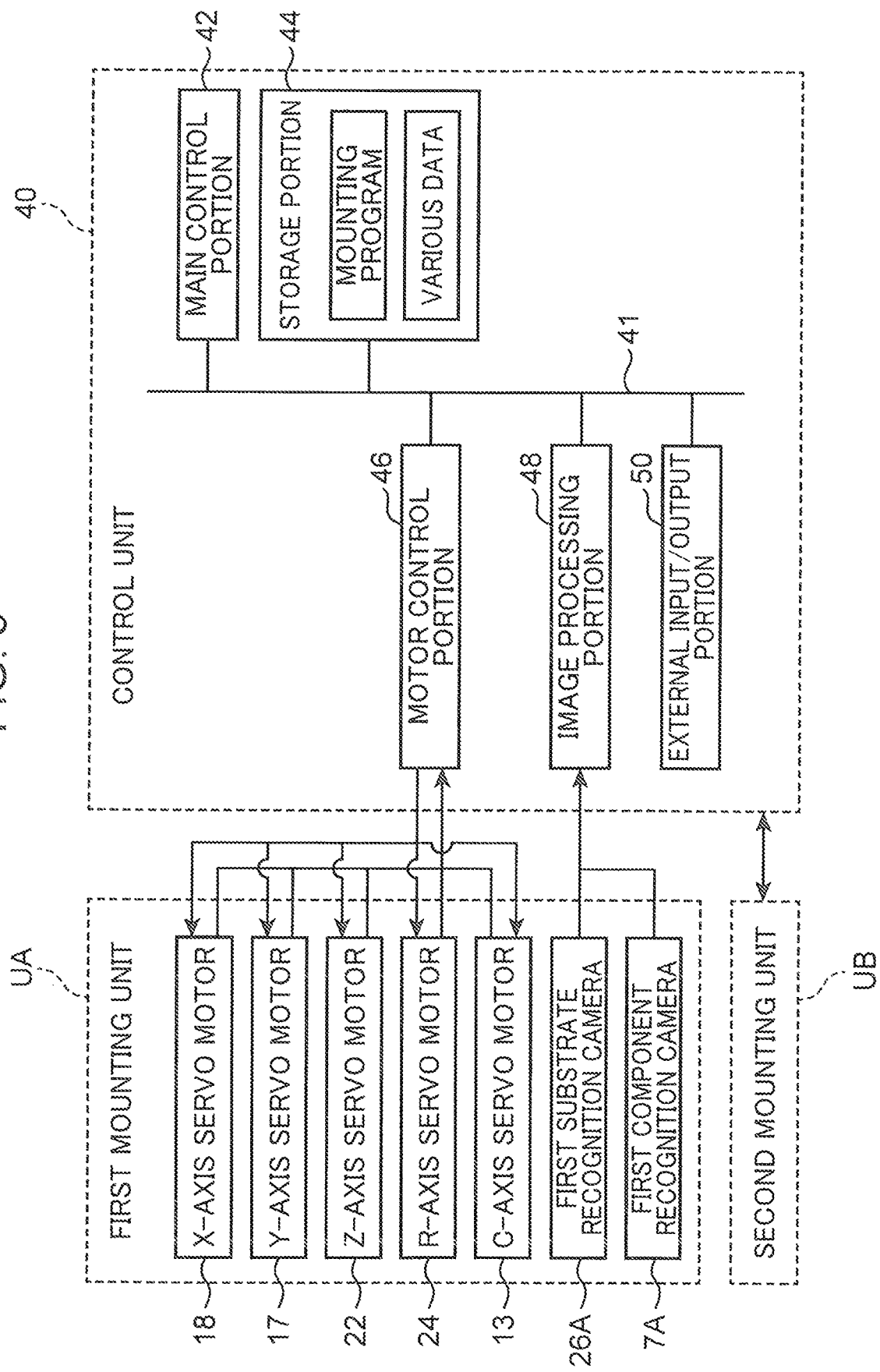
FIG. 3 is a block diagram showing a control system of the component mounting apparatus.

As shown in FIG. 3, the control unit 40 includes a main control portion 42 which generally controls operation of the component mounting apparatus 1, a storage portion 44 which stores a program and various data, a motor control portion 46 which controls drive of the servo motors 13, 17, 18, 22, and 24 on X, Y, Z, R, and C axes, an image processing portion 48 which subjects data of an image picked up by the substrate recognition cameras 26A and 26B, and the component recognition cameras 7A and 7B to predetermined processing, and an external input/output portion 50. The main control portion 42, which is a computer constituted by a CPU and a memory, is connected to the storage portion 44, the motor control portion 46, the image processing portion 48, and the external input/output portion 50 via a bus 41.

The main control portion 42 executes a mounting program necessary for mounting a component on the substrate P, as well as executing various arithmetic processing for the mounting. In particular, during component mounting operation, the main control portion 42 executes operation of selecting a mark to be imaged from the first to fifth marks M1 to M5 according to a mounting mode or a position of the movable conveyor 11 of each of the lanes L1 and L2, imaging the selected mark by the substrate recognition cameras 26A and 26B at predetermined timing, calculating a movement error of each of the head units 6A and 6B (i.e. the first and second mounting heads 20A and 20B) on the basis of the image data, and further calculating a correction value thereof (correction value arithmetic processing). In other words, in this example, the main control portion 42 corresponds to a control device and a calculation device of the present disclosure.

The storage portion 44 stores a mounting program to be executed by the main control portion 42 and various data necessary for executing a mounting program. In particular, when the main control portion 42 calculates the above correction value for correcting a movement error of each of the head units 6A and 6B, the correction value is updated and stored.

The motor control portion 46 controls the motors 13, 17, 18, 22, and 24 on the basis of a signal from an encoder contained in each of the motors 13, 17, 18, 22, and 24 and information applied from the main control portion 42. The image processing portion 48 is connected to the first component recognition camera 7A, the second component recognition camera 7B, and the first substrate recognition camera 26A and the second substrate recognition camera 26B, and takes in a signal indicative of an image from these cameras 7A, 7B, and 26A, 26B, subjects the signal to predetermined image processing, and sends the image data to the main control portion 42. To the external input/output portion 50, various sensors provided in the mounting units UA and UB are connected as input elements, and the projection device 32 and the like are connected as output elements.

In this example, the first, third, and fifth marks M1, M3, and M5, the substrate recognition cameras 26A and 26B of the first and second mounting units UA and UB, and the main control portion 42 correspond to a movement error detection apparatus of a mounting head of the present disclosure.

[Operation of Component Mounting Apparatus]

Mounting modes executed by the component mounting apparatus 1 are roughly classified into a parallel mounting mode (parallel mounting operation) in which the first mounting unit UA and the second mounting unit UB individually mount components on the substrates P of the lanes L1 and L2 thereof, and an entry mounting mode in which the first mounting unit UA and the second mounting unit UB mount a component on a substrate P in cooperation with each other. Then, the entry mounting mode is further divided into a single-lane entry mounting mode (one-sided entry mounting operation) in which only one of the two lanes L1 and L2 is used and a both-lane entry mounting mode (bidirectional entry mounting operation) in which the two lanes L1 and L2 are used. Contents of each mounting mode are as follows.

1) Parallel Mounting Mode

The parallel mounting mode is a mode in which only the first head unit 6A mounts a component on the substrate P arranged at the first work position WpA of the first lane L1, and only the second head unit 6B mounts a component on the substrate P arranged at the second work position WpB of the second lane L2 as shown in FIG. 1. In other words, while the first head unit 6A sucks a component from the tape feeder 12 of the first component supply portion 5A to mount the component on the substrate P of the first lane L1, the second head unit 6B sucks a component from the tape feeder 12 of the second component supply portion 5B to mount the component on the substrate P of the second lane L2. In this case, after the component suction, the first head unit 6A passes above the first component recognition camera 7A and the second head unit 6B passes above the second component recognition camera 7B, resulting in imaging the sucked component to recognize a state of the component sucked by the mounting heads 20A and 20B. Then, a target loading position of the component is corrected on the basis of the state of the component sucked by the mounting heads 20A and 20B and the correction value for correcting movement errors of the head units 6A and 6B, thereby controlling the head units 6A and 6B on the basis of the target loading position.

2) Single-Lane Entry Mounting Mode

The single-lane entry mounting mode is a mode in which while the substrate P is conveyed by only either one of the lanes L1 and L2 (see FIG. 7A and FIG. 7B), both the first and second head units 6A and 6B mount a component on the substrate P arranged at a work position of the lane. Operation such as recognition of a state of a component sucked by the component recognition cameras 7A and 7B is similar to that in the parallel mounting mode.

3) Both-Lane Entry Mounting Mode

The both-lane entry mounting mode is a mode in which while the substrate P is sequentially arranged at the work positions WpA and WpB of any of the first and second lanes L1 and L2 in a predetermined order or at random, both the first and second head units 6A and 6B mount a component on the substrate P. Operation such as recognition of a state of a component sucked by the component recognition cameras 7A and 7B is similar to that in the parallel mounting mode.

[Control of Correction Value Arithmetic Processing]

Figure 4:
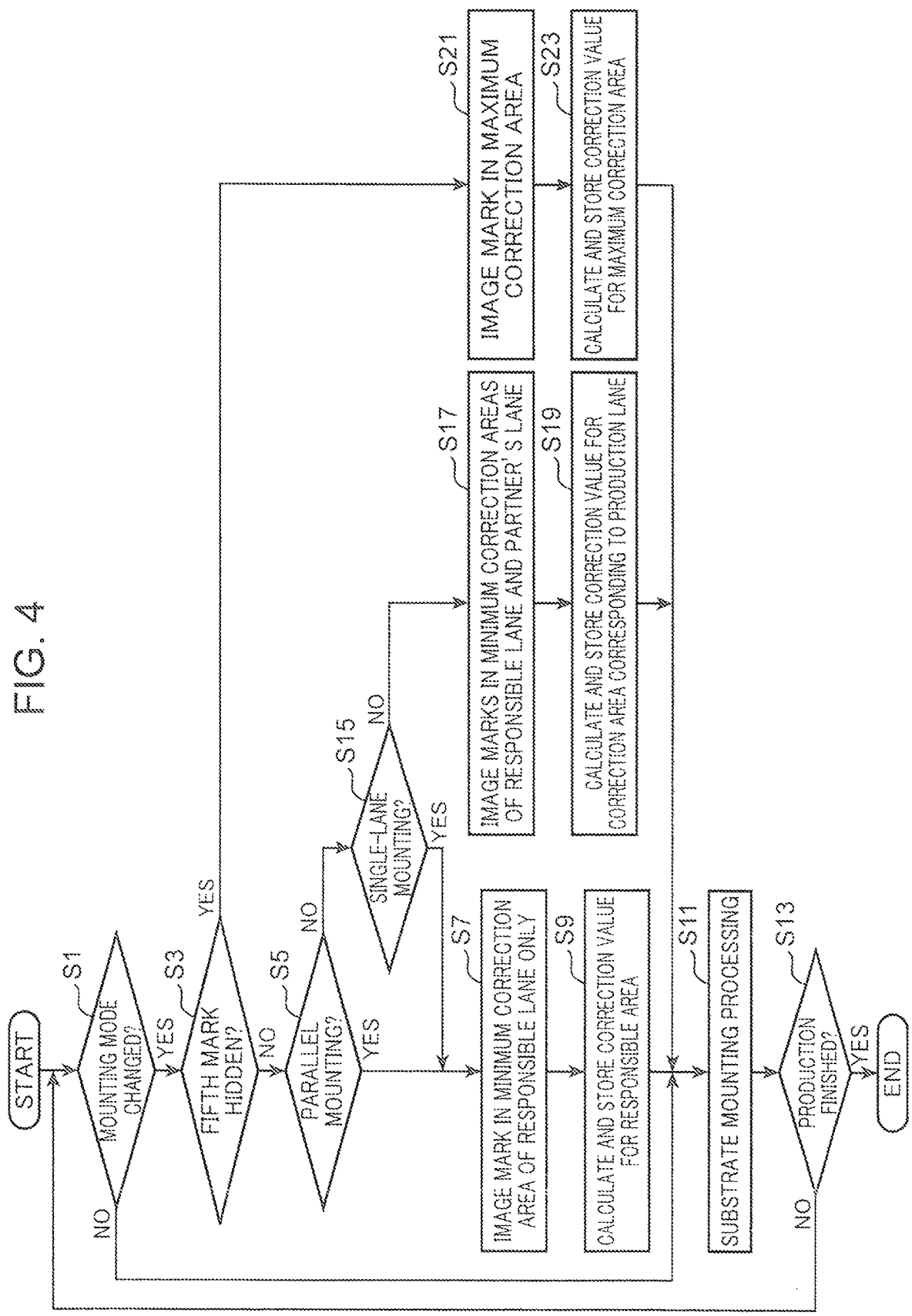
FIG. 4 is a flow chart showing one example of correction value arithmetic processing control by a control unit.

FIG. 4 is a flow chart showing one example of the above correction value arithmetic processing control by the main control portion 42. The correction value arithmetic processing is processing for obtaining a correction value for correcting a movement error of each of the head units 6A and 6B (i.e. the mounting heads 20A and 20B) caused by thermal deformation of the head unit drive mechanism as described above.

When the flow chart starts, the main control portion 42 first determines whether a mounting mode of the component mounting apparatus 1 has been changed or not (Step S1). When the determination is YES, the main control portion 42 determines whether the fifth mark M5 is hidden by the movable conveyor 11 or not (Step S3). Specifically, the main control portion 42 obtains a position of the movable conveyor 11 of each of the substrate conveyance devices 4A and 4B on the basis of a signal from the encoder contained in the C-axis servo motor 13 of the conveyor width variable mechanism and determines whether the position of the movable conveyor 11 is within a predetermined range of a position of the fifth mark M5 or not.

When the determination is NO, the main control portion 42 determines whether the mounting mode is the parallel mounting mode or not (Step S5), and when the determination is YES, the main control portion 42 executes operation of imaging marks in minimum correction areas of the lanes L1 and L2 assigned to the head units 6A and 6B respectively by the substrate recognition cameras 26A and 26B (Step S7), calculates a correction value of a movement error of each of the head units 6A and 6B with respect to each of areas assigned to the head units 6A and 6B on the basis of an image of the mark, and updates and stores the correction value (Step S9).

The above correction value is obtained for each of the head units 6A and 6B on the basis of images of three marks among the marks M1 to M5, the three marks being aligned at right angles when connected by a straight line and being imaged by the substrate recognition cameras 26A and 26B. A specific method of calculating such a correction value is a conventionally known technique (e.g. Japanese Patent No. 3253218 recited in the Background Art, etc.) and therefore no detailed description thereof will be made here.

As to selection of a mark to be imaged, when a mark at a position away from the position of the substrate P is selected, an exact movement error at the position (responsible area) of the substrate P does not be reflected in a correction value and when a mark at a position not falling in the entire region of the substrate P is selected, a movement error is insufficiently corrected, so that in either case, reliability of a correction value is reduced. Thus, the main control portion 42 selects a mark in a minimum correction area of each of the lanes L1 and L2 assigned to the head units 6A and 6B, respectively, so as to avoid such problem as much as possible.

A minimum correction area mark represents a mark at a position where an area (correction area) in which a target loading position to be corrected becomes minimum. Specifically, the minimum correction area mark is a mark closest to the substrate P (hereinafter, referred to as a closest mark), which, in the X direction, is a closest mark located on an outer side of the substrate P in the X direction, and which in the Y direction, is a closest mark located on an outer side of the substrate P in the Y direction. Since in this example, marks aligned in the X direction are only the first and second marks M1 and M2 and the third and fourth marks M3 and M4, minimum correction area marks in the X direction are the first and second marks M1 and M2 or the third and fourth marks M3 and M4 at any time as described above.

For example, assuming that FIG. 1 shows the parallel mounting mode, a responsible area of the first head unit 6A is the substrate P arranged at the first work position WpA of the first lane L1. Accordingly, minimum correction area marks for the first head unit 6A are the first and second marks M1 and M2 in the X direction and are the first and fifth marks M1 and M5 in the Y direction. On the other hand, a responsible area of the second head unit 6B is the substrate P arranged at the second work position WpB of the second lane L2. Accordingly, minimum correction area marks for the second head unit 6B are the third and fourth marks M3 and M4 in the X direction and the third and fifth marks M3 and M5 in the Y direction.

Accordingly, in Step S7, the main control portion 42 sequentially images the first, second, and fifth marks M1, M2, and M5 by the first substrate recognition camera 26A of the first head unit 6A by controlling the head units 6A and 6B (corresponding to a first imaging operation in the present disclosure), as well as sequentially imaging the third, fourth, and fifth marks M3, M4, and M5 by the second substrate recognition camera 26B of the second head unit 6B (corresponding to a second imaging operation in the present disclosure).

Then, in Step S8, the main control portion 42 calculates movement errors in the X and Y directions of the first head unit 6A on the basis of positions of images of the first, second, and fifth marks M1, M2, and M5, and calculates correction values for the movement errors, while calculating movement errors in the X and Y directions of the second head unit 6B on the basis of positions of images of the third, fourth, and fifth marks M3, M4, and M5, and calculating correction values for the movement errors. Then, the main control portion 42 updates and stores the correction values for the head units 6A and 6B, respectively, in the storage portion 44.

Returning to FIG. 4, when the determination is NO in Step S5, that is, when the determination is made that the mounting mode is not the parallel mounting mode, the main control portion 42 further determines whether the mounting mode is the single-lane entry mounting mode or not (Step S15). When the determination is YES, the main control portion 42 shifts the processing to Step S7, where in a similar manner to a case of the parallel mounting mode, minimum correction area marks of the lanes L1 and L2 assigned to the head units 6A and 6B are selected and the marks are imaged by the substrate recognition cameras 26A and 26B. Then, in Step S8, correction values for movement errors of the head units 6A and 6B are calculated on the basis of the mark images to update and store the correction values in the storage portion 44.

Figure 7B:
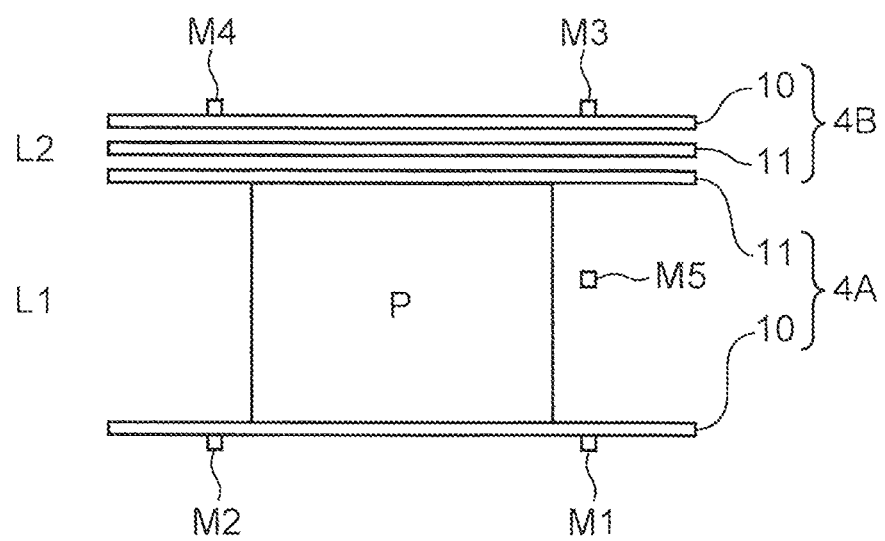
FIG. 7B is a plan schematic view of the first and second substrate conveyance devices showing another form of arrangement of the movable conveyor in the parallel mounting mode.

FIG. 7A and FIG. 7B each show one example of a form of the single-lane entry mounting mode. FIG. 7A shows a case where production of a substrate P is conducted only in the first lane L1 in the lane form similar to that as in the parallel mounting shown in FIG. 1, and FIG. 7B shows a case where production of a large-scale substrate P is conducted in the first lane L1, with the first lane L1 set at a maximum interval.

In these cases, responsible areas of the head units 6A and 6B are both the substrate P in the first lane L1. Then, in a case of the example shown in FIG. 7A, since the fifth mark M5 is positioned on the outer side of the first lane L1 in the Y direction, minimum correction area marks for both the head units 6A and 6B are the first and second marks M1 and M2, and the fifth mark M5. On the other hand, in a case of the example shown in FIG. 7B, since the fifth mark M5 is positioned on the inner side of the first lane L1 in the Y direction, minimum correction area marks for both the head units 6A and 6A are the first and second marks M1 and M2, and the third mark M3.

Accordingly, in a case of the example shown in FIG. 7A, in Step S7, the main control portion 42 sequentially images the first, second, and fifth marks M1, M2, and M5 by the first substrate recognition camera 26A of the first head unit 6A by controlling the head units 6A and 6B (corresponding to the first imaging operation in the present disclosure), as well as sequentially imaging the first, second, and fifth marks M1, M2, and M5 by the second substrate recognition camera 26B of the second head unit 6B (corresponding to fourth imaging operation in the present disclosure). Then, in Step S8, the main control portion 42 calculates movement errors in the X and Y directions of the head units 6A and 6B on the basis of positions of images of the first, second, and fifth marks M1, M2, and M5, and calculates correction values for the movement errors. Then, the main control portion 42 updates and stores the correction values for the head units 6A and 6B, respectively, in the storage portion 44.

On the other hand, in a case of the example shown in FIG. 7B, in Step S7, the main control portion 42 sequentially images the first, second, and third marks M1, M2, and M3 by the first substrate recognition camera 26A of the first head unit 6A by controlling the head units 6A and 6B (corresponding to the first imaging operation in the present disclosure), as well as sequentially imaging the first, second, and third marks M1, M2, and M3 by the second substrate recognition camera 26B of the second head unit 6B (corresponding to the fourth imaging operation in the present disclosure). Then, in Step S8, the main control portion 42 calculates movement errors in the X and Y directions of the first head unit 6A on the basis of positions of images of the first, second, and third marks M1, M2, and M3 picked up by the first substrate recognition camera 26A, as well as calculating movement errors in the X and Y directions of the second head unit 6B on the basis of positions of images of the first, second, and third marks M1, M2, and M3 picked up by the second substrate recognition camera 26B. Then, the main control portion 42 updates and stores the correction values for the head units 6A and 6B, respectively, in the storage portion 44.

Although not shown, when production of the substrate P is conducted only in the second lane L2, either responsible area of the head units 6A and 6B is the substrate P in the second lane L2. In this case, a mark closest to the substrate P arranged at the second work position WpB is imaged by the second substrate recognition camera 26B (corresponding to the second imaging operation in the present disclosure), while the closest mark is imaged by the first substrate recognition camera 26A (corresponding to third mounting operation of the present disclosure). Then, the main control portion 42 calculates movement errors in the X and Y directions of the second head unit 6B on the basis of the image of the mark picked up by the second substrate recognition camera 26B, and calculates movement errors in the X and Y directions of the first head unit 6A on the basis of the image of the mark picked up by the first substrate recognition camera 26A. Then, the main control portion 42 updates and stores the correction values for the head units 6A and 6B, respectively, in the storage portion 44.

Returning to FIG. 4, when the determination is NO in Step S15, that is, when the determination is made that the mounting mode is the both-lane entry mounting mode, the main control portion 42 shifts the processing to Step S17. The main control portion 42 executes operation of, in addition to minimum correction area marks of the lanes L1 and L2 assigned to the head units 6A and 6B, imaging a minimum correction area mark in the partner's lane, that is, a minimum correction area mark when each of the head units 6A and 6B gets on the partner's lane, by the substrate recognition cameras 26A and 26B. Then, on the basis of the mark images, the main control portion 42 calculates a correction value for a movement error of the first head unit 6A with respect to each area assigned to the first head unit 6A, while calculating a correction value for a movement error of the second head unit 6B with respect to each area assigned to the second head unit 6B, and updating and storing these correction values in the storage portion 44 (Step S19).

For example, assuming that FIG. 1 shows the both-lane entry mounting mode, since responsible areas of the first head unit 6A are the substrates P arranged at the work positions WpA and WpB in both the lanes L1 and L2, minimum correction area marks for the first head unit 6A are a mark group including the first, second, and fifth marks M1, M2, and M5 as one set, and a mark group including the third, fourth, and fifth marks M3, M4, and M5 as one set. On the other hand, since responsible areas of the second head unit 6B are also the substrates P arranged at the work positions WpA and WpB in both the lanes L1 and L2, minimum correction area marks for the second head unit 6B are the same as the above two mark groups.

Accordingly, in Step S17, the main control portion 42 sequentially images all the marks M1 to M5 by the first substrate recognition camera 26A of the first head unit 6A (corresponding to the first and third imaging operations in the present disclosure), and sequentially images all the marks M1 to M5 by the second substrate recognition camera 26B of the second head unit 6B (corresponding to the second and fourth imaging operations in the present disclosure).

Then, in Step S19, the main control portion 42 calculates movement errors in the X and Y directions of the first head unit 6A in the first lane L1 on the basis of images of the first, second, and fifth marks M1, M2, and M5 and calculates correction values for the movement errors (referred to as a first correction value for the first unit), as well as calculating movement errors in the X and Y directions of the first head unit 6A in the second lane L2 on the basis of images of the third, fourth, and fifth marks M3, M4, and M5 and calculating correction values for the movement errors (referred to as a second correction value for the first unit). Additionally, the main control portion 42 calculates movement errors in the X and Y directions of the second head unit 6B in the first lane L1 on the basis of the images of the first, second, and fifth marks M1, M2, and M5 and calculates correction values for the movement errors (referred to as a first correction value for the second unit), as well as calculating movement errors in the X and Y directions of the second head unit 6B in the second lane L2 on the basis of the images of the third, fourth, and fifth marks M3, M4, and M5 and calculating correction values for the movement errors (referred to as a second correction value for the second unit). Then, the correction values for the head units 6A and 6B are updated and stored in the storage portion 44.

Returning to FIG. 4, when the determination is YES in Step S3, that is, when the determination is made that the fifth mark M5 is hidden, the main control portion 42 executes operation of imaging maximum correction area marks by the substrate recognition cameras 26A and 26B irrespective of the mounting mode (Step S21), and further calculates a correction value for a movement error of each of the head units 6A and 6B on the basis of an image of the mark and updates and stores the correction value in the storage portion 44.

The maximum correction area marks are marks positioned at both ends in the X direction of each of the head units 6A and 6B irrespective of a responsible area, and are marks positioned at both ends in the Y direction. For example, as shown in FIG. 8, when the fifth mark M5 is hidden by the movable conveyor 11 of the first lane L1, maximum correction area marks for the first head unit 6A are the first, second, and third marks M1, M2, and M3. On the other hand, maximum correction area marks for the second head unit 6B are the first, third, and fourth marks M1, M3, and M4.

Accordingly, in Step S21, the main control portion 42 sequentially images the first, second, and third marks M1, M2, and M3 by the first substrate recognition camera 26A of the first head unit 6A by controlling the head units 6A and 6B, as well as sequentially imaging the first, third, and fourth marks M1, M3, and M4 by the second substrate recognition camera 26B of the second head unit 6B.

Then, in Step S23, the main control portion 42 calculates movement errors in the X and Y directions of the first head unit 6A on the basis of images the first, second, and third marks M1, M2, and M3 and calculates correction values for the movement errors, as well as similarly calculating movement errors in the X and Y directions of the second head unit 6B on the basis of images of the first, third, and fourth marks M1, M3, and M4 and calculating correction values for the movement errors. Then, the main control portion 42 updates and stores the correction values for the head units 6A and 6B, respectively, in the storage portion 44.

Returning to FIG. 4, when any processing in Steps S9, S19, and S23 is finished, the main control portion 42 shifts the processing to Step S11. In Step S11, the main control portion 42 waits for the substrate P to be arranged at the work positions WpA and WpB, and when the substrate P is arranged at the work positions WpA and WpB, controls the head units 6A and 6B to mount a component on the substrate P. On this occasion, the main control portion 42 reads, on the basis of a current mounting mode, data of the correction value corresponding to the mounting mode currently stored in the storage portion 44, corrects a target loading position of the component on the basis of the correction value, and mounts the component on the substrate P on the basis of the corrected target loading position.

In this case, in particular when the mounting mode is the both-lane entry mounting mode, a target loading position of the component is corrected in the following manner First, when the substrate P is arranged at the first work position WpA of the first lane L1, with respect to a loading position of the substrate P assigned to the first head unit 6A, a target loading position is corrected on the basis of the first correction value for the first unit, and with respect to a loading position assigned to the second head unit 6B, a target loading position is corrected on the basis of the first correction value for the second unit. Then, when the substrate P is arranged at the second work position WpB of the second lane L2, with respect to a loading position of the substrate P assigned to the first head unit 6A, a target loading position is corrected on the basis of the second correction value for the first unit, and with respect to a loading position assigned to the second head unit 6B, a target loading position is corrected on the basis of the second correction value for the second unit.

When the processing in Step S11 is finished, the main control portion 42 determines whether production of the substrate P in the current mounting mode is finished or not, and in a case of the determination of NO, the processing returns to Step S1 to continue production of the substrate P, and when the determination is ultimately YES in Step S13, the main control portion 42 finishes the flow chart.

[Function, Effects, etc. of Component Mounting Apparatus]

According to the above component mounting apparatus 1, among the five marks M1 to M5, a suitable mark is selected according to a size and a position (a position of each movable conveyor 11) of the substrate P and a mounting mode, and the correction value of each of the head units 6A and 6B is obtained on the basis of the mark. In particular, in such a case, since basically, minimum correction area marks of the lanes L1 and L2 assigned to the head units 6A and 6B, that is, marks closest to the substrates P arranged at the work positions WpA and WpB are selected, reliability of a correction value is increased as compared with a conventional apparatus (Japanese Patent No. 3253218 in the Background Art) in which irrespective of a size and a position of the substrate P, a mark at a determined position is constantly imaged to obtain a correction value. In particular, the component mounting apparatus 1, in which provision of a mark (the fifth mark M5) in a movable region of the movable conveyor 11 increases flexibility in selecting a mark in the Y direction and all the marks M1 to M5 including the fifth mark M5 are all fixedly arranged, does not involve a problem that a mark has a movement error, the problem of a conventional apparatus (Japanese Patent No. 5495260 in the Background Art) in which a mark is fixed to a movable conveyor. Accordingly, the component mounting apparatus 1 achieves higher reliability of a correction value to be obtained and therefore has an advantage of an increase in precision of component mounting by the head units 6A and 6B as compared with a conventional apparatus.

Additionally, in the component mounting apparatus 1, basically, minimum correction area marks of the lanes L1 and L2 assigned to the head units 6A and 6B are selected and imaged as described above. Therefore, another advantage is produced that while increasing reliability of a correction value, time for imaging a mark by each of the substrate recognition cameras 26A and 26B can be reduced.

Additionally, according to the component mounting apparatus 1, in particular in the both-lane entry mounting mode, not only a correction value in a case where the substrates P are arranged in the lanes L1 and L2 to which the head units 6A and 6B belong, respectively, but also a correction value in a case where the substrates P are arranged in the partner's lanes L1 and L2 into which the head units 6A and 6B enter are obtained. Then, since the correction values are selectively used according to a lane (the work positions WpA and WpB) in which the substrate P is to be carried, another advantage is produced that production of the substrate P can be efficiently carried out. In other words, in the both-lane entry mounting mode, in which of the two lanes L1 and L2, the substrate P is to be carried depends on progress of work in an upstream step. In this case, production is not efficient when the marks M1 to M5 are imaged to obtain a correction value after actually carrying substrates P into the lanes L1 and L2 and determining a lane to be used. In this respect, according to the above component mounting apparatus 1 in which correction values for the head units 6A and 6B are obtained in advance for a case where the substrate P is arranged in each of the lanes L1 and L2, the processing is allowed to immediately shift to production of the substrate P in either case where the substrate P is carried in to the lanes L1 or L2. Accordingly, production of the substrate P can be efficiently carried out in the both-lane entry mounting mode.

Additionally, because of provision of the fifth mark M5 within the same reference plane IP as those of the other marks M1 to M4 by forming a projected image of the fifth mark M5 in a movable region of the movable conveyor 11, the component mounting apparatus 1 has an advantage that without hindering movement of the movable conveyor 11 at all, the fifth mark M5 can be provided in a movable region of the movable conveyor 11.

Other Modification Example

The above-described component mounting apparatus 1 is illustrative of a preferred embodiment of the component mounting apparatus according to the present disclosure, and a specific configuration thereof can be appropriately changed without departing from the gist of the present disclosure.

For example, although in the above component mounting apparatus 1, the fifth mark M5 is provided between the first mark M1 and the third mark M3, more marks may be provided. For example, a sixth mark M6 may be provided between the first mark M1 and the fifth mark M5 in a similar manner to that of the fifth mark M5, and a seventh mark M7 may be provided between the third mark M3 and the fifth mark M5 in a similar manner to that of the fifth mark M5 as shown in FIG. 9A. In this configuration, when large and small substrates P having different sizes are produced in the parallel mounting mode as shown in, for example, FIG. 9B, a correction value of a movement error of the first head unit 6A can obtained on the basis of the first, second, and sixth marks M1, M2, and M6 and a correction value of a movement error of the second head unit 6B can be obtained on the basis of the third, fourth, and sixth marks M3, M4, and M6, thereby enabling a correction value to be obtained using marks more corresponding to the size of the substrate P. Therefore, it is effective in further increasing precision of mounting a component by the head units 6A and 6B.

Additionally, as shown in FIG. 10A, the sixth mark M6 may be provided between the first mark M1 and the second mark M2 in a similar manner to the first and second marks M1 and M2, and the seventh mark M7 may be provided between the third mark M3 and the fourth mark M4 in a similar manner to the third and fourth marks M3 and M4. In this configuration, when a substrate P having a small size in the X direction is produced in the parallel mounting mode as shown in, for example, FIG. 10B, obtaining a correction value for the first head unit 6A on the basis of the first, fifth, and sixth marks M1, M5, and M6 and obtaining a correction value for the second head unit 6B on the basis of the third, fifth, and seventh marks M3, M5, and M7 enables a correction value to be obtained which is more corresponding to the size of the substrate P in the X direction and has high reliability. Therefore, it is effective in increasing precision of mounting a component by the head units 6A and 6B.

Additionally, the component mounting apparatus 1 of each embodiment is a dual lane system component mounting apparatus. However, the component mounting apparatus 1 may be a single lane component mounting apparatus.

Figure 11A:
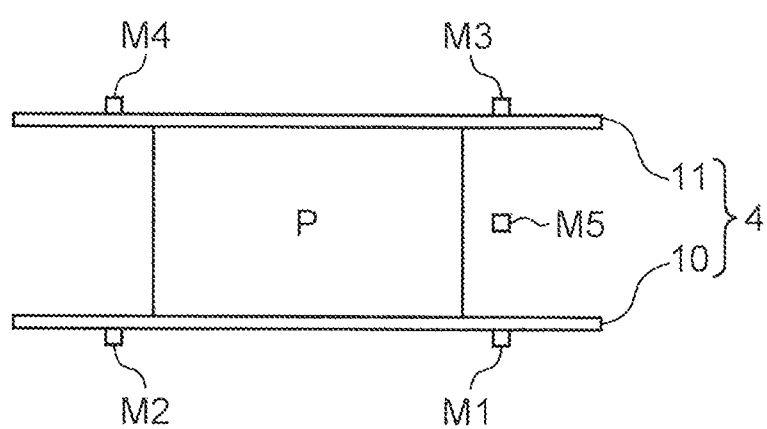
FIG. 11A is a plan schematic view of a single lane component mounting apparatus in which a positional relationship between a conveyor and a mark is shown.

In this case, as shown in, for example, FIG. 11A, it is only necessary that in a state where the conveyors 10 and 11 of a substrate conveyance device 4 are fixed at a maximum interval, the first and second marks M1 and M2 are arranged along the fixed conveyor 10 and at a front side thereof, the third and fourth marks M3 and M4 are arranged along the movable conveyor 11 and at a rear side thereof, and the fifth mark M5 is arranged at a middle position in the Y direction between the first mark M1 and the third mark M3. According to this configuration, at the time of production of a large-sized substrates P, a correction value in the Y direction can be obtained on the basis of the first mark M1 and the third mark M3 as shown in FIG. 11A, and at the time of production of a small-sized substrates P, a correction value in the Y direction can be obtained on the basis of the first mark M1 and the fifth mark M5 as shown in FIG. 11B. It is therefore possible to obtain a correction value which is more corresponding to the size of the substrate P and has high reliability in the single lane component mounting apparatus 1.

Additionally, although in each embodiment, a movement error is obtained for each of the head units 6A and 6B on the basis of images of three marks, the three marks being aligned at right angles when connected by a straight line and being imaged by the substrate recognition cameras 26A and 26B, the three marks may not necessarily be aligned at right angles. Additionally, the number of marks to be recognized for obtaining movement errors for the head units 6A and 6B is not limited to three but may be four or more.

Also, although in each embodiment, the projection device 32 is provided which projects a projected image on the reference plane IP as the fifth mark M5, the device may form a reflected image on the reference plane IP as the fifth mark M5.

The present disclosure described in the foregoing is summarized as follows.

In other words, the present disclosure is a movement error detection apparatus of a mounting head to be applied to a component mounting apparatus equipped with a substrate conveyance device which includes a fixed conveyor extending in a first direction and a movable conveyor which is movable in a second direction orthogonal to the first direction with respect to the fixed conveyor, and equipped with a mounting head which mounts a component on a substrate conveyed by the substrate conveyance device to a predetermined work position. The movement error detection apparatus of a mounting head includes a movable region inside mark made of a projected image or a reflected image formed in a movable region of the movable conveyor, and a pair of movable region outside marks respectively provided on both sides of the movable region inside mark in the second direction and arranged outside the movable region of the movable conveyor and outward of the substrate at the work position. The movement error detection apparatus of a mounting head further includes an imaging device which moves together with the mounting head, a control device which selects, among the movable region inside mark and the pair of movable region outside marks, two marks that are positioned on both outer sides of the substrate in the second direction and are closest to the substrate, and causes the imaging device to image the marks, and a calculation device which obtains a movement error of the mounting head on the basis of two mark images picked up by the imaging device.

With the configuration of the movement error detection apparatus, of the movable region inside mark and the pair of movable region outside marks, a suitable mark is selected according to a size and a position of the substrate, that is, a mark closest to the substrate P is selected, and a movement error of the mounting head is obtained on the basis of an image of the mark. Therefore, a movement error of a mounting head caused by thermal deformation of a drive system can be corrected with higher precision according to a size and a position of a substrate. Further, the movable region inside mark is made of a projected image or a reflected image formed in a movable region of the movable conveyor and is arranged in the movable region without hindering movement of the movable conveyor. Therefore, the movement error detection apparatus does not involve a problem that a mark has a movement error, the problem of a conventional apparatus (Japanese Patent No. 5495260 in Background Art) in which a mark is fixed to a movable conveyor, and also in this respect, the movement error detection apparatus enables correction of a movement error in the second direction of the mounting head with high precision.

In the movement error detection apparatus, it is suitable that the movable region inside mark includes a plurality of movable region inside marks aligned in the second direction, and the pair of movable region outside marks are provided on both sides of the plurality of movable region inside marks in the second direction.

Since the configuration increases flexibility in selecting a mark when two marks closest to the substrate are selected, it is advantageous in obtaining a movement error of the mounting head with high precision.

The above movement error detection apparatus includes a first mounting unit including the substrate conveyance device, the mounting head, and the imaging device, and a second mounting unit. The second mounting unit includes another substrate conveyance device, another mounting head, and another imaging device and in which a movable conveyor of the another substrate conveyance device and a movable conveyor of the substrate conveyance device of the first mounting unit are arranged to be adjacent to each other in the second direction, in which the pair of movable region outside marks are arranged outside fixed conveyors of the first mounting unit and the second mounting unit, and the movable region inside mark is arranged in movable regions of the movable conveyors of the first mounting unit and the second mounting unit. When the mounting head and the imaging device of the first mounting unit are defined as a first mounting head and a first imaging device, respectively, and the mounting head and the imaging device of the second mounting unit are defined as a second mounting head and a second imaging device, respectively, a work position of a substrate in the first mounting unit is defined as a first work position, a work position of a substrate in the second mounting unit is defined as a second work position, and of the pair of movable region outside marks, a movable region outside mark on a side of the first mounting unit is defined as a first movable region outside mark, and a movable region outside mark on a side of the second mounting unit is defined as a second movable region outside mark.

The control device may execute at least one of imaging operations among a first imaging operation of selecting two marks which are positioned on both outer sides of a substrate arranged at the first work position and are closest to the substrate, and include at least the first movable region outside mark, and causing the first imaging device to image the selected marks; a second imaging operation of selecting two marks which are positioned on both outer sides of a substrate arranged at the second work position and are closest to the substrate, and include at least the second movable region outside mark, and causing the second imaging device to image the selected marks; a third imaging operation of selecting two marks which are positioned on both outer sides of a substrate arranged at the second work position and are closest to the substrate, and include at least the second movable region outside mark, and causing the first imaging device to image the selected marks; and a fourth imaging operation of selecting two marks which are positioned on both outer sides of a substrate arranged at the first work position and are closest to the substrate, and include at least the first movable region outside mark, and causing the second imaging device to image the selected marks, and in which the calculation device may obtain a movement error of at least one of the first mounting head and the second mounting head on the basis of a mark image picked up in the imaging operation executed by the control device.

In the configuration of the movement error detection apparatus, parallel arrangement of the first mounting unit and the second mounting unit enables diversification of a mounting form (mounting mode). Then, in thus diversified mounting form, movement errors of the first mounting head and the second mounting head can be detected with high precision according to a mounting form thereof.

In this case, it is suitable that the component mounting apparatus executes parallel mounting operation of mounting a component on a substrate arranged at the first work position only by the first mounting head, and mounting a component on a substrate arranged at the second work position only by the second mounting head, the control device executes the first imaging operation and the second imaging operation, and the calculation device obtains a movement error of the first mounting head on the basis of a mark image picked up in the first imaging operation, and obtains a movement error of the second mounting head on the basis of a mark image picked up in the second imaging operation.

The configuration enables movement errors of the first mounting head and the second mounting head to be suitably obtained within a necessary and sufficient range in the parallel mounting operation.

Additionally, in a case where the component mounting apparatus executes one-sided entry mounting operation of, while sequentially carrying in a substrate to either one of the first work position and the second work position, mounting a component on the substrate by both the first mounting head and the second mounting head, when the substrate is carried in only to the first work position in the one-sided entry mounting operation, the control device preferably executes the first imaging operation and the fourth imaging operation, while when the substrate is carried in only to the second work position, preferably executes the second imaging operation and the third imaging operation, and when the substrate is carried in only to the first work position, the calculation device preferably obtains a movement error of the first mounting head on the basis of a mark image picked up in the first imaging operation, as well as obtaining a movement error of the second mounting head on the basis of a mark image picked up in the fourth imaging operation, and when the substrate is carried in only to the second work position, preferably obtains a movement error of the second mounting head on the basis of a mark image picked up in the second imaging operation, as well as obtaining a movement error of the first mounting head on the basis of a mark image picked up in the third imaging operation.

The configuration enables movement errors of the first mounting head and the second mounting head to be suitably obtained within a necessary and sufficient range in the one-sided entry mounting operation.

Additionally, in a case where the component mounting apparatus executes bidirectional entry mounting operation of, while selectively carrying in a substrate to any of the first work position and the second work position, mounting a component on the substrate by both the first mounting head and the second mounting head, the control device suitably executes the first imaging operation to the fourth imaging operation, and the calculation device suitably obtains a movement error of the first mounting head on the basis of each mark image picked up in the first imaging operation and the third imaging operation, as well as obtaining a movement error of the second mounting head on the basis of each mark image picked up in the second imaging operation and the fourth imaging operation.

The configuration enables movement errors of the first mounting head and the second mounting head to be suitably obtained within a necessary and sufficient range in the bidirectional entry mounting operation.

In the above movement error detection apparatus, the control device suitably executes the imaging operation before substrates are arranged at the first work position and the second work position.

Since in the configuration, movement errors of the first mounting head and the second mounting head can be obtained in advance without interrupting component mounting work, mounting work can be conducted more efficiently.

On the other hand, the component mounting apparatus of the present disclosure includes a substrate conveyance device which includes a fixed conveyor extending in a first direction and a movable conveyor which is movable in a second direction orthogonal to the first direction with respect to the fixed conveyor; a mounting head which mounts a component on a substrate conveyed by the substrate conveyance device to a predetermined work position; and any one of the above movement error detection apparatuses for detecting a movement error of the mounting head.

Since the component mounting apparatus enables correction of a movement error of a mounting head caused by thermal deformation of a drive system with higher precision according to a size and a position of a substrate as described above, mounting precision of the component is increased accordingly.

What is claimed is:

1. A movement error detection apparatus of a mounting head to be applied to a component mounting apparatus equipped with a substrate conveyance device which includes a fixed conveyor extending in a first direction and a movable conveyor which is movable in a second direction orthogonal to the first direction with respect to the fixed conveyor, and equipped with a mounting head which mounts a component on a substrate conveyed by the substrate conveyance device to a predetermined work position, the movement error detection apparatus of a mounting head comprising:
   a movable region inside mark made of a projected image or a reflected image formed in a movable region of the movable conveyor;
   a pair of movable region outside marks respectively provided on both sides of the movable region inside mark in the second direction and arranged outside the movable region of the movable conveyor and outward of the substrate at the work position;
   an imager which moves together with the mounting head;
   a controller which selects, among the movable region inside mark and the pair of movable region outside marks, two marks that are positioned on both outer sides of the substrate in the second direction and are closest to the substrate, and causes the imager to image the marks; and
   a calculator which obtains a movement error of the mounting head on a basis of two mark images picked up by the imager.

2. The movement error detection apparatus of a mounting head according to claim 1, wherein
   the movable region inside mark includes a plurality of movable region inside marks aligned in the second direction, and
   the pair of movable region outside marks are provided on both sides of the plurality of movable region inside marks in the second direction.

3. The movement error detection apparatus of a mounting head according to claim 1, comprising:
   a first mounting unit including the substrate conveyance device, the mounting head, and the imager, and
   a second mounting unit which includes another substrate conveyance device, another mounting head, and another imager and in which a movable conveyor of the another substrate conveyance device and a movable conveyor of the substrate conveyance device of the first mounting unit are arranged to be adjacent to each other in the second direction, wherein
   the pair of movable region outside marks are arranged outside fixed conveyors of the first mounting unit and the second mounting unit, and the movable region inside mark is arranged in movable regions of the movable conveyors of the first mounting unit and the second mounting unit, and wherein when the mounting head and the imager of the first mounting unit are defined as a first mounting head and a first imager, respectively, and the mounting head and the imager of the second mounting unit are defined as a second mounting head and a second imager, respectively, a work position of a substrate in the first mounting unit is defined as a first work position, and a work position of a substrate in the second mounting unit is defined as a second work position, and of the pair of movable region outside marks, a movable region outside mark on a side of the first mounting unit is defined as a first movable region outside mark, and a movable region outside mark on a side of the second mounting unit is defined as a second movable region outside mark, the controller executes at least one of imaging operations of:
- a first imaging operation of selecting two marks which are positioned on both outer sides of a substrate arranged at the first work position and are closest to the substrate, and include at least the first movable region outside mark, and causing the first imager to image the marks which are selected;
- a second imaging operation of selecting two marks which are positioned on both outer sides of a substrate arranged at the second work position and are closest to the substrate, and include at least the second movable region outside mark, and causing the second imager to image the marks which are selected;
- a third imaging operation of selecting two marks which are positioned on both outer sides of a substrate arranged at the second work position and are closest to the substrate, and include at least the second movable region outside mark, and causing the first imager to image the marks which are selected; and
- a fourth imaging operation of selecting two marks which are positioned on both outer sides of a substrate arranged at the first work position and are closest to the substrate, and include at least the first movable region outside mark, and causing the second imager to image the marks which are selected, and the calculator obtains a movement error of at least one of the first mounting head and the second mounting head on the basis of a mark image picked up in the imaging operation executed by the controller.

4. The movement error detection apparatus of a mounting head according to claim 3, wherein the component mounting apparatus executes parallel mounting operation of mounting a component on a substrate arranged at the first work position only by the first mounting head, and mounting a component on a substrate arranged at the second work position only by the second mounting head, the controller executes the first imaging operation and the second imaging operation, and the calculator obtains a movement error of the first mounting head on the basis of a mark image picked up in the first imaging operation, and obtains a movement error of the second mounting head on the basis of a mark image picked up in the second imaging operation.

5. The movement error detection apparatus of a mounting head according to claim 3, wherein the component mounting apparatus executes one-sided entry mounting operation of, while sequentially carrying in a substrate to either one of the first work position and the second work position, mounting a component on the substrate by both the first mounting head and the second mounting head, when the substrate is carried in only to the first work position in the one-sided entry mounting operation, the controller executes the first imaging operation and the fourth imaging operation, while when the substrate is carried in only to the second work position, the controller executes the second imaging operation and the third imaging operation, and when the substrate is carried in only to the first work position, the calculator obtains a movement error of the first mounting head on the basis of a mark image picked up in the first imaging operation, as well as obtaining a movement error of the second mounting head on the basis of a mark image picked up in the fourth imaging operation, and when the substrate is carried in only to the second work position, the calculator obtains a movement error of the second mounting head on the basis of a mark image picked up in the second imaging operation, as well as obtaining a movement error of the first mounting head on the basis of a mark image picked up in the third imaging operation.

6. The movement error detection apparatus of a mounting head according to claim 3, wherein the component mounting apparatus executes bidirectional entry mounting operation of, while selectively carrying in a substrate to any of the first work position and the second work position, mounting a component on the substrate by both the first mounting head and the second mounting head, the controller executes the first imaging operation to the fourth imaging operation, and the calculator obtains a movement error of the first mounting head on the basis of each mark image picked up in the first imaging operation and the third imaging operation, as well as obtaining a movement error of the second mounting head on the basis of each mark image picked up in the second imaging operation and the fourth imaging operation.

7. The movement error detection apparatus of a mounting head according to claim 1, wherein the controller executes the imaging operation before substrates are arranged at the first work position and the second work position.

8. A component mounting apparatus comprising:

a substrate conveyance device which includes a fixed conveyor extending in a first direction and a movable conveyor which is movable in a second direction orthogonal to the first direction with respect to the fixed conveyor;

a mounting head which mounts a component on a substrate conveyed by the substrate conveyance device to a predetermined work position; and a movement error detection apparatus according to claim 1 for detecting a movement error of the mounting head.

9. The movement error detection apparatus of a mounting head according to claim 2, comprising:

a first mounting unit including the substrate conveyance device, the mounting head, and the imager, and a second mounting unit which includes another substrate conveyance device, another mounting head, and another imager and in which a movable conveyor of the another substrate conveyance device and a movable conveyor of the substrate conveyance device of the first mounting unit are arranged to be adjacent to each other in the second direction, wherein the pair of movable region outside marks are arranged outside fixed conveyors of the first mounting unit and the second mounting unit, and the movable region inside mark is arranged in movable regions of the movable conveyors of the first mounting unit and the second mounting unit, and wherein when the mounting head and the imager of the first mounting unit are defined as a first mounting head and a first imager, respectively, and the mounting head and the imager of the second mounting unit are defined as a second mounting head and a second imager, respectively, a work position of a substrate in the first mounting unit is defined as a first work position, and a work position of a substrate in the second mounting unit is defined as a second work position, and of the pair of movable region outside marks, a movable region outside mark on a side of the first mounting unit is defined as a first movable region outside mark, and a movable region outside mark on a side of the second mounting unit is defined as a second movable region outside mark, the controller executes at least one of imaging operations of:

a first imaging operation of selecting two marks which are positioned on both outer sides of a substrate arranged at the first work position and are closest to the substrate, and include at least the first movable region outside mark, and causing the first imager to image the marks which are selected;

a second imaging operation of selecting two marks which are positioned on both outer sides of a substrate arranged at the second work position and are closest to the substrate, and include at least the second movable region outside mark, and causing the second imager to image the marks which are selected;

a third imaging operation of selecting two marks which are positioned on both outer sides of a substrate arranged at the second work position and are closest to the substrate, and include at least the second movable region outside mark, and causing the first imager to image the marks which are selected; and a fourth imaging operation of selecting two marks which are positioned on both outer sides of a substrate arranged at the first work position and are closest to the substrate, and include at least the first movable region outside mark, and causing the second imager to image the marks which are selected, and the calculator obtains a movement error of at least one of the first mounting head and the second mounting head on the basis of a mark image picked up in the imaging operation executed by the controller.

10. The movement error detection apparatus of a mounting head according to claim 9, wherein the component mounting apparatus executes parallel mounting operation of mounting a component on a substrate arranged at the first work position only by the first mounting head, and mounting a component on a substrate arranged at the second work position only by the second mounting head, the controller executes the first imaging operation and the second imaging operation, and the calculator obtains a movement error of the first mounting head on the basis of a mark image picked up in the first imaging operation, and obtains a movement error of the second mounting head on the basis of a mark image picked up in the second imaging operation.

11. The movement error detection apparatus of a mounting head according to claim 9, wherein the component mounting apparatus executes one-sided entry mounting operation of, while sequentially carrying in a substrate to either one of the first work position and the second work position, mounting a component on the substrate by both the first mounting head and the second mounting head, when the substrate is carried in only to the first work position in the one-sided entry mounting operation, the controller executes the first imaging operation and the fourth imaging operation, while when the substrate is carried in only to the second work position, the controller executes the second imaging operation and the third imaging operation, and when the substrate is carried in only to the first work position, the calculator obtains a movement error of the first mounting head on the basis of a mark image picked up in the first imaging operation, as well as obtaining a movement error of the second mounting head on the basis of a mark image picked up in the fourth imaging operation, and when the substrate is carried in only to the second work position, the calculator obtains a movement error of the second mounting head on the basis of a mark image picked up in the second imaging operation, as well as obtaining a movement error of the first mounting head on the basis of a mark image picked up in the third imaging operation.

12. The movement error detection apparatus of a mounting head according to claim 9, wherein the component mounting apparatus executes bidirectional entry mounting operation of, while selectively carrying in a substrate to any of the first work position and the second work position, mounting a component on the substrate by both the first mounting head and the second mounting head, the controller executes the first imaging operation to the fourth imaging operation, and the calculator obtains a movement error of the first mounting head on the basis of each mark image picked up in the first imaging operation and the third imaging operation, as well as obtaining a movement error of the second mounting head on the basis of each mark image picked up in the second imaging operation and the fourth imaging operation.

13. The movement error detection apparatus of a mounting head according to claim 2, wherein the controller executes the imaging operation before substrates are arranged at the first work position and the second work position.

14. The movement error detection apparatus of a mounting head according to claim 3, wherein the controller executes the imaging operation before substrates are arranged at the first work position and the second work position.

15. The movement error detection apparatus of a mounting head according to claim 4, wherein the controller executes the imaging operation before substrates are arranged at the first work position and the second work position.

16. The movement error detection apparatus of a mounting head according to claim 5, wherein
the controller executes the imaging operation before substrates are arranged at the first work position and the second work position.

* * * * *